US009677236B2

United States Patent
Edmondson (10) Patent No.: US 9,677,236 B2
(45) Date of Patent: Jun. 13, 2017

(54) SYSTEMS AND METHODS FOR MOBILE ELECTROFISHING MONITORING

(75) Inventor: Joseph Curtis Edmondson, Beaverton, OR (US)

(73) Assignee: Smith-Root, Inc., Vancouver, WA (US)

( * ) Notice: Subject to any disclaimer, the term of this patent is extended or adjusted under 35 U.S.C. 154(b) by 266 days.

(21) Appl. No.: 13/238,964

(22) Filed: Sep. 21, 2011

(65) Prior Publication Data

US 2013/0073239 A1    Mar. 21, 2013

(51) Int. Cl.
| | |
|---|---|
| *E02B 1/00* | (2006.01) |
| *A01K 79/02* | (2006.01) |
| *G06F 19/00* | (2011.01) |
| *G01R 21/00* | (2006.01) |
| *A01M 29/24* | (2011.01) |

(52) U.S. Cl.
CPC .............. *E02B 1/006* (2013.01); *A01K 79/02* (2013.01); *A01M 29/24* (2013.01); *G01R 21/00* (2013.01); *G06F 19/00* (2013.01)

(58) Field of Classification Search
CPC ......... E02B 1/006; A01K 79/02; G01R 21/00; A01M 29/24; G06F 19/00
See application file for complete search history.

(56) References Cited

U.S. PATENT DOCUMENTS

| | | | | |
|---|---|---|---|---|
| 4,593,648 | A * | 6/1986 | Marzluf | 119/220 |
| 5,327,854 | A * | 7/1994 | Smith et al. | 119/220 |
| 5,369,365 | A * | 11/1994 | Waitman | 324/444 |
| 5,386,368 | A * | 1/1995 | Knight | G05D 1/0208 114/144 A |
| 2005/0095931 | A1* | 5/2005 | Takada et al. | 440/53 |

OTHER PUBLICATIONS

A. Lawrence Kolz, "In-water Electrical Measurements for Evaluating Electrofishing Systems" U.S. Department of the Interior Fish and Wildlife Service, Biological Report 11, Apr. 1993.*
BathyBoat: Bathymetry Mapping and Analysis, Jul. 5, 2008, available at https://web.archive.org/web/20080705171722/http://www.engin.umich.edu/dept/name/facilities/mhl/projects/BathyBoat.html.*
Ning Xu, "A Survey of Sensor Network Applications" Jul. 27, 2007 at https://web.archive.org/web/20070727201914/http://courses.cs.tamu.edu/rabi/cpsc617/resources/sensor%20nw-survey.pdf.*
Tinka et al., "Quadratic Programming based data assimilation with passive drifting sensors for shallow water flows" 48th IEEE Conference on Decision & Control, Dec. 16-18, 2009.*
Cayirci et al., "Wireless sensor networks for underwater surveillance systems" Ad Hoc Networks 4 (2006).*
Akyildiz et al., "Underwater acoustic sensor networks: research challenges" Ad Hoc Networks 3 (2005).*

* cited by examiner

Primary Examiner — Alexander Satanovsky
Assistant Examiner — John Kuan
(74) Attorney, Agent, or Firm — J. Curtis Edmondson, Patent Attorney; Anitha Shankar Narayan, Patent Agent; Law Office of J. Curtis Edmondson (57) ABSTRACT

A mobile electric field monitor with a floatable housing, an electric field probe, and a computer processor to measure the electric field generated by an electrofisher while the electrofisher is being used in a body of water, this mobile electric field monitor is coupled to computing system to generate a three dimensional map of electric field.

4 Claims, 7 Drawing Sheets

Prior Art

SYSTEMS AND METHODS FOR MOBILE ELECTROFISHING MONITORING

RELATED APPLICATIONS

This application claims the benefit of U.S. Provisional Application No. 61/349,144 filed May 27, 2010, the contents herein incorporated into this application by reference.

BACKGROUND

The present inventive subject matter relates to the systems and methods for mobile electrofishing electric field analysis and protection.

The protection and preservation of natural resources includes the management of fish and game. Fish move about lakes, rivers, streams and reservoirs for a variety of reasons, including migration, spawning, and searching for food. Water intakes divert water for drinking, irrigation, and industrial uses. The introduction of fish into intakes is generally regarded as an unwanted event, and, in some cases, is expressly prohibited by federal government mandates such as the "Endangered Species Act" and the EPA "Clean Water Act." As the need for governing the movement and migration of fish has been recognized, means for achieving this goal have also been developed.

Furthermore, techniques of electrofishing have also been used freshwater lakes and streams and are the subject of U.S. Pat. Nos. 5,445,111; 5,327,854; 4,672,967; 4,713,315; 5,111,379; 5,233,782; 5,270,912; 5,305,711; 5,311,694; 5,327,668; 5,341,764; 5,551,377; and 6,978,734 which are incorporated herein by reference.

The maximum transfer of energy from water to a fish occurs when the fish's electrical conductivity matches the electrical conductivity of the surrounding water. In most circumstances, a fish's body is normally more conductive than fresh water. As a result, the fish's body acts as a "voltage divider" when swimming through fresh water, and the gradient of an electrical field in the body of a fish will typically be less than the voltage gradient in the same space filled by fresh water. That is, the voltage gradient is altered in a region proximate a fish in the zone of an electric fish barrier. Nevertheless, all other factors remaining equal, the voltage gradient in the body of a fish will be roughly proportional to the voltage gradient in the same region of fresh water when no fish are present. Accordingly, if the voltage gradient in a region of water is doubled, the voltage gradient across the fish (and the electrical current through the fish) will also double. The effectiveness of an electric fish barrier on a particular fish, therefore, depends on the voltage field gradient produced by the electric fish barrier.

The voltage gradients in the region of water may be adjusted to cause a physiological reaction in the fish. If a voltage gradient in a region of water is too weak, the fish will not feel appreciable discomfort, and will travel undaunted by the electric fish barrier. An "annoying region" will cause a fish to turn around and travel the preferred route. Conversely, early experiments have demonstrated that if a moderately annoying region of the electric barrier is too narrow to allow a fish to turn around, then the rapidly swimming fish passes quickly through the "annoying" region and then into the "painful region". The rapid transition from the annoying to the painful may induce large fish to react so violently in their attempt to change direction that they have actually snapped their own spine. As a result of these observations, an ideal fish barrier will normally have a wide region with a moderately annoying voltage gradient, increasing at a rate that causes increasing discomfort to fish of various sizes and species, but allowing ample room for a fish experiencing discomfort to turn around before passing completely through the annoying region and into a painful or lethal region. The awareness of the field gradient should, therefore, not be a sudden discovery, but a gradually growing annoyance. Whether a fish barrier is effective, ineffective or harmful is thus a function of the shape of the boundary, the thickness and the intensity of a voltage gradient produced by an electric fish barrier.

The current passing through a fish depends on a variety of factors such as the conductivity of the water at both ends of the fish, the total resistance in a conductive path of water, and the size and species of a fish being repelled, etc. Typically, higher gradients are necessary to control the travel and migration of smaller fish, and lower gradients are effective for larger fish. The effectiveness of a particular strength gradient also depends on the species of fish, and whether the motion of the water reliably flows in a direction to orient the fish along the axis of the strongest gradient, which is perpendicular to the equipotential voltage plane. However, a voltage gradient of one hundred volts per meter has been observed to establish a good base-line voltage gradient for effectively and yet safely deterring average size fish from entering a prohibited area. It is understood that higher and lower voltage gradients may be appropriate according to a variety of factors. First, the electric field is generated fixed barrier that typically runs along the bottom of a riverbed (see prior art FIG. 1)

During electrofishing with pulsed DC electric current, a fish will have several reactions, depending upon the field strength or density in which it finds itself and upon the frequency, shape and width of the pulses. The first reaction is that of frightening the fish. A second reaction is electrotaxis, the involuntary exercise of swimming muscles to draw the fish toward the source of electric current. The third reaction is narcosis when the muscles go limp and the fish rolls on its side; this permits netting and acquisition of the fish. The fourth reaction is tetanus which is an involuntary contraction of the muscles without interleaved relaxation and can result in death. A fifth reaction can occur if the white muscles of the fish are stimulated to the point of an epileptic seizure, thereby causing morphological trauma.

Since the inception of electrofishing for scientific purposes, there have been reports of injuries to fish due to exposure to electric stimuli. The injuries include compression of the spinal column, torn supportive tissues around various organs and broken blood vessels (hematomas). In general, these injuries have been thought to be the result of high current densities which may be encountered by the fish near an electrode.

In normal electrofishing practice, direct current or pulsed direct current is used because aquatic animals will move, in general, to the anode electrode. In the case of fish, this movement, electrotaxis, involves a pseudo swimming reaction. As a fish approaches the anode electrode, it encounters an exponentially increasing field strength. At some critical value of field strength, depending upon many physical factors, such as the water conductivity, the fish may cease electrotaxis action, enter a state of narcosis and then tetanus, a few feet from the anode electrode or very near it. Often, the critical state occurs a few feet from the anode electrode or very near it. In either case, the fish almost always drifts near to or may actually touch the anode electrode. The field strength within this zone causing tetanus is very high and a significant flow of electric current through the fish occurs. This electric current is generally believed to stimulate and then overwhelm the neuromuscular system of the fish. It is believed that the overwhelmed neuromuscular system causes the above referenced trauma.

As some aquatic species are protected or may be protected under the endangered species act, it may be necessary to minimize the electric field applied to an aquatic endangered species during electrofishing. This minimization can be accomplished by placing remote electric field monitors in a body of water proximate to the electrofishing apparatus. These remote electric field monitors can operate by storing "time stamp" electric field data into an internal memory to be retrieved at a later date. Alternately, the electric field data can be relayed to a central data collecting point by wireless technology. Furthermore, the electric field data can be correlated with the GPS location of the remote electric field monitor.

SUMMARY

The present inventive subject matter overcomes problems in the prior art by providing for systems and methods for a mobile electric field monitor having a floatable housing, an electric field probe, the electric field probe adjustable downwards from the floatable housing, a computer processor, the computer processor connected to the electric field probe, such that the electric field probe measures the electric field generated by an electrofisher while floating on a body of water. The mobile electric field monitor having a computer processor that has a time stamp associated with the reading of the electric field. The mobile electric field monitor further with a location stamp associated with the reading of the electric field. The mobile electric field monitor having a power source capable of moving the mobile electric field monitor; and a rudder capable of steering the mobile electric field monitor; where that the mobile electric field monitor may be relocated within a body of water. The mobile efield monitor having an internal programming system that designates certain waypoints over a body of water.

The present inventive subject matter also provides for a mobile electrofisher electric field monitoring system having a multiplicity of mobile electrofisher monitors, the mobile eletrofisher monitors operably able to monitor an electric field, then connect to a base station, and then transmit a multiplicity of electric field measurements from the mobile electrofisher monitor to the base station.

The process of using multiple electric field monitors for electrofishing, the process having the steps of: (1) measuring an electric field in an area proximate to an electrofisher; (2) measuring a geographic location coincident with the measured electric field; (3) transmitting the electric field measurements and to a system operable to store the electric field measurements and the geographic location; (4) mapping the electric field measurement based on the geographic location to provide a map of the electric field proximate to an electrofisher.

The foregoing is not intended to be an exhaustive list of embodiments and features of the present inventive subject matter. Persons skilled in the art are capable of appreciating other embodiments and features from the following detailed description in conjunction with the drawings.

REFERENCE CHARACTERS

110 Operator
120 Mobile Electrofisher
130 Anode Pole
140 Rat-Tail Cathode
150 Induced Electric Field
160 Aquatic Species
200 Mobile efield monitor
210 Water
220 Body
230 Electric Field Probe
310 Electric field probe
320 Central processing unit
330,340 Wireless communication unit
420 Base station
410 Base station wireless connection
510 Electric field
530 Sampled
540 Electric field map
610 Power Source
620 Rudder
710 Electrofishing Boat

DETAILED DESCRIPTION

Representative embodiments according to the inventive subject matter are shown in FIGS. 1-7 wherein similar features share common reference numerals.

Figure 1:
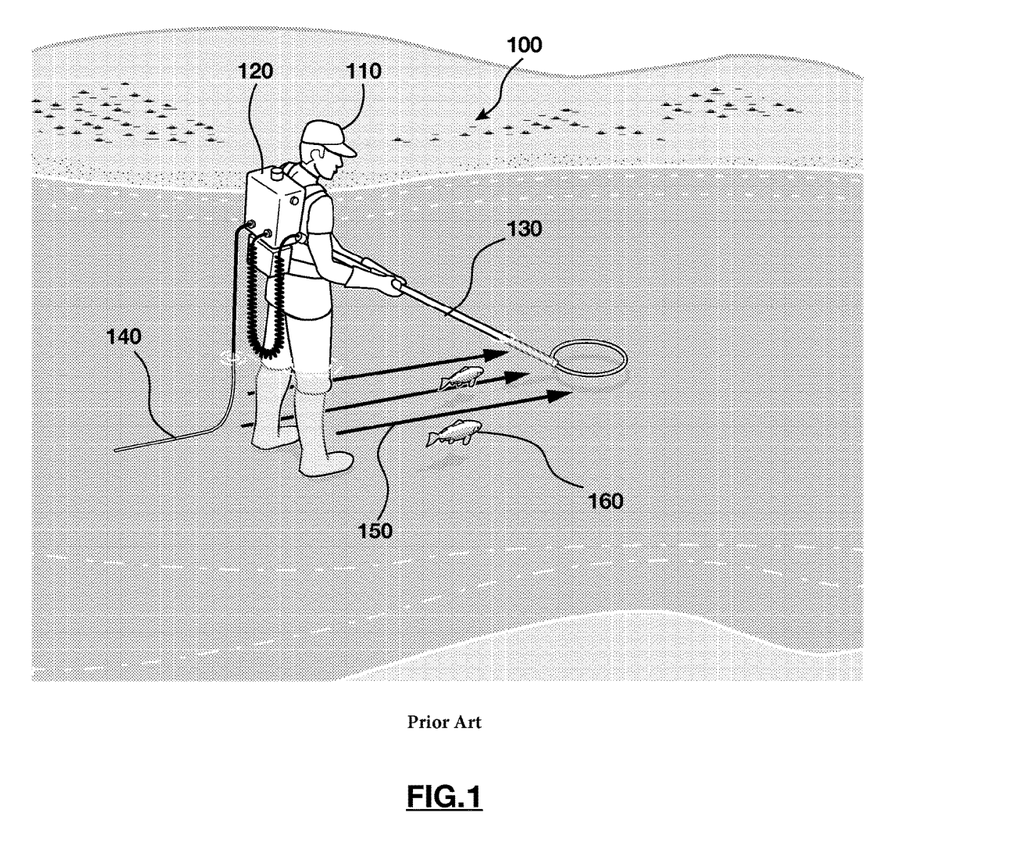
FIG. 1 is a prior art diagram of electrofishing in a body of water.

Now referring to FIG. 1 which depicts the prior art configuration of the use of a mobile electrofisher 100. The mobile electrofisher 100 includes an operator 110, a back-pack-type pulse generator 120, an anode pole 130, a rat-tail cathode 140, an induced electric field 150, and an aquatic species 160. As the operator 110 sweeps the anode pole 130 through the water, the electric field 150 is induced between the anode pole 130 and the rat-tail cathode 140 which affects the nearby aquatic species 160, controlling the swimming direction, orientation, and assemblage of the aquatic species 160, or even the biological state (e.g., electrotaxis, stun, etc. . . . ) of the aquatic species 160.

Figure 2:
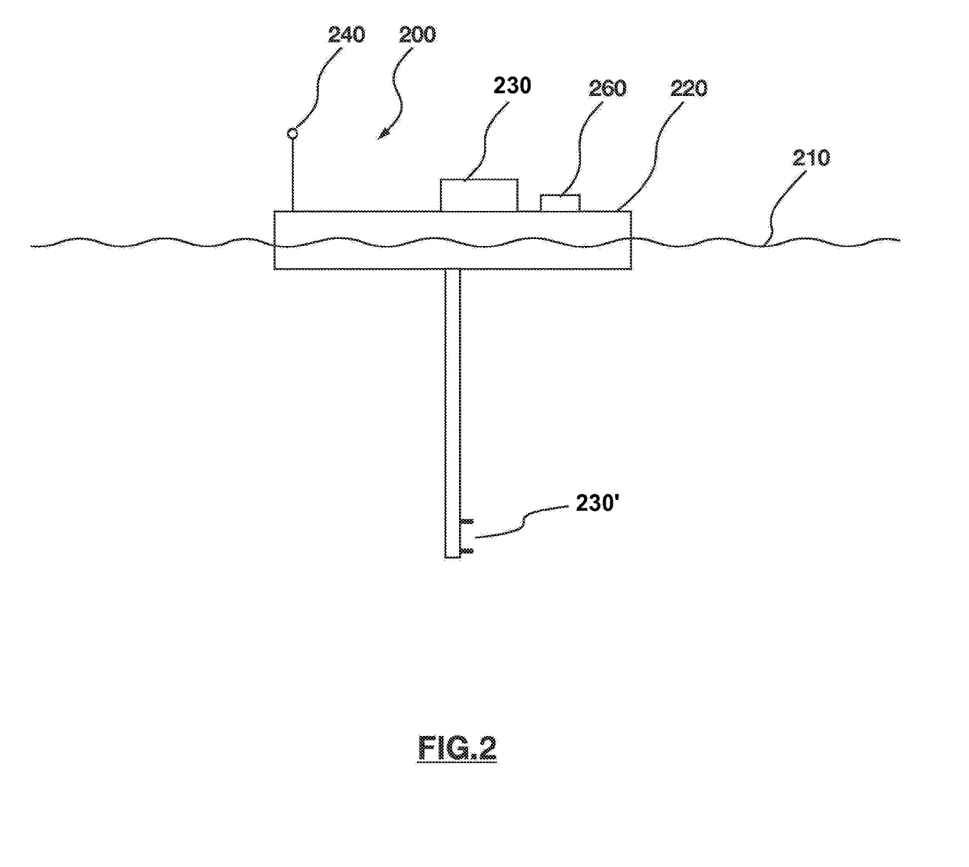
FIG. 2 is a representative diagram of the preferred embodiment of the mobile electrofishing monitor.

Referring to FIG. 2, an example of a mobile and floatable electric field monitor is illustrated. The mobile electric field or efield monitor 200 floats on the water 210. The body 220 of the mobile efield monitor 200 floats on the water 210 with an electric field probe 230, which includes a detector portion 230', extending downwards, below the surface of the water. The electric field probe 230, 230' can be adjusted to any depth, but will typically be set at a depth where aquatic species will be most present. Although one electric field probe 230, 230' is shown here, the electric field monitor 200 may have an array (not shown) of electric field probes that can measure the electric field at multiple depths.

Figure 3:
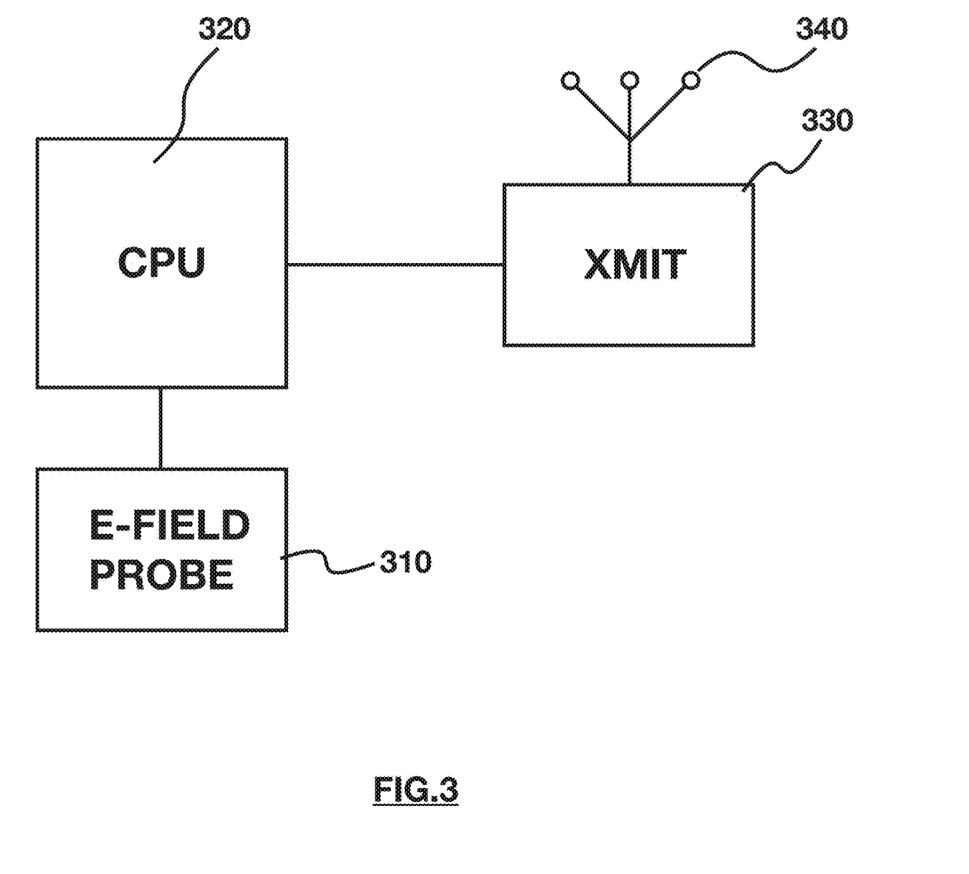
FIG. 3 is block diagram of the preferred embodiment of the mobile electrofishing monitor.

Now referring to FIG. 3 which depicts a system block diagram of the inventive subject matter. The electric field probe 310 is connected to a central processing unit 320 which programmatically gathers data from the electric field probe. Also included in this data may be a "time-stamp" indicating the time and date of a particular data point, a "location-stamp" indicating a location of the mobile e-field monitor (this location being determined by local determination or by GPS). Further connected to the central processing unit is a wireless communication unit 330,340. The wireless communication unit 330,340 being able to communicate with a remote base station and/or other mobile electric field monitoring units.

Figure 4:
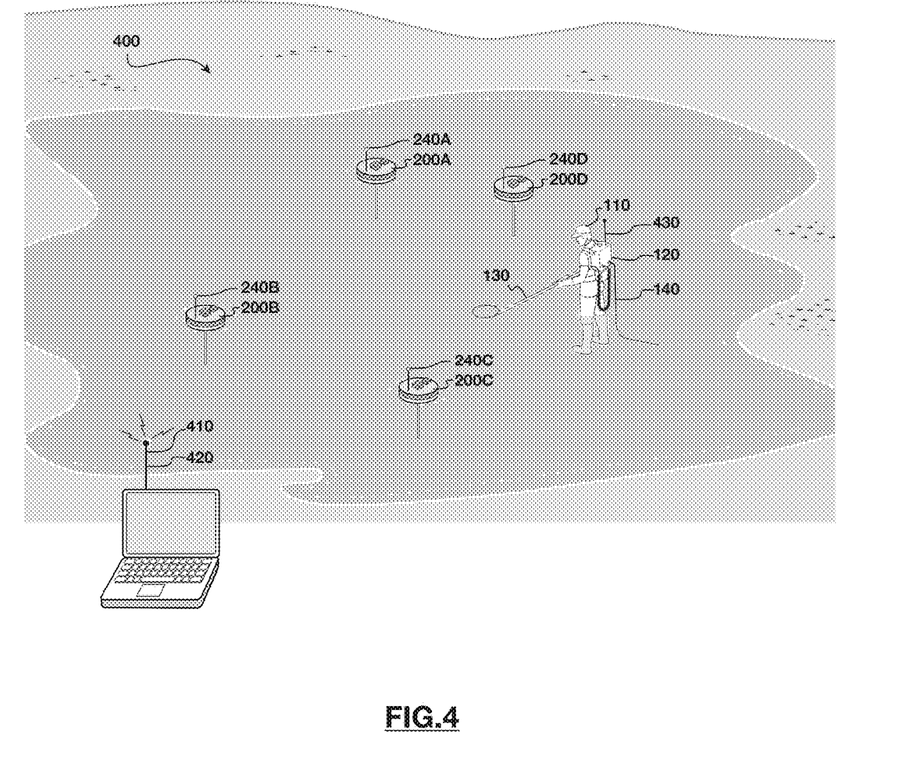
FIG. 4 is representative diagram of the preferred embodiment of multiple electrofishing monitors integrated with a monitoring computer.

Now referring to FIG. 4 which illustrates the use of the mobile electrofisher in the field. The operator 110 with the mobile electrofisher 120 has an anode pole 130 and a rat-tail cathode 140 which generates an electric field in the water. The mobile electrofisher monitors 200A, 200B, 200C, 200D are wirelessly 240A, 240B, 240C, 240D connected to the base station 420 which has a base station wireless connection 410. The mobile electrofisher monitors can also transmit electric field information from the electric field monitors to a electrofisher wireless 430 monitor.

It is understood by those well versed in the art of computer programming and software development that the data produced by each of the mobile electric field monitors 200A, 200B, 200C, 200D can be seemlessly connected to the base station 420. The base station 420 can then process the data to generate electric field maps that display the electric fields in a real time and/or graphical basis.

Figure 5:
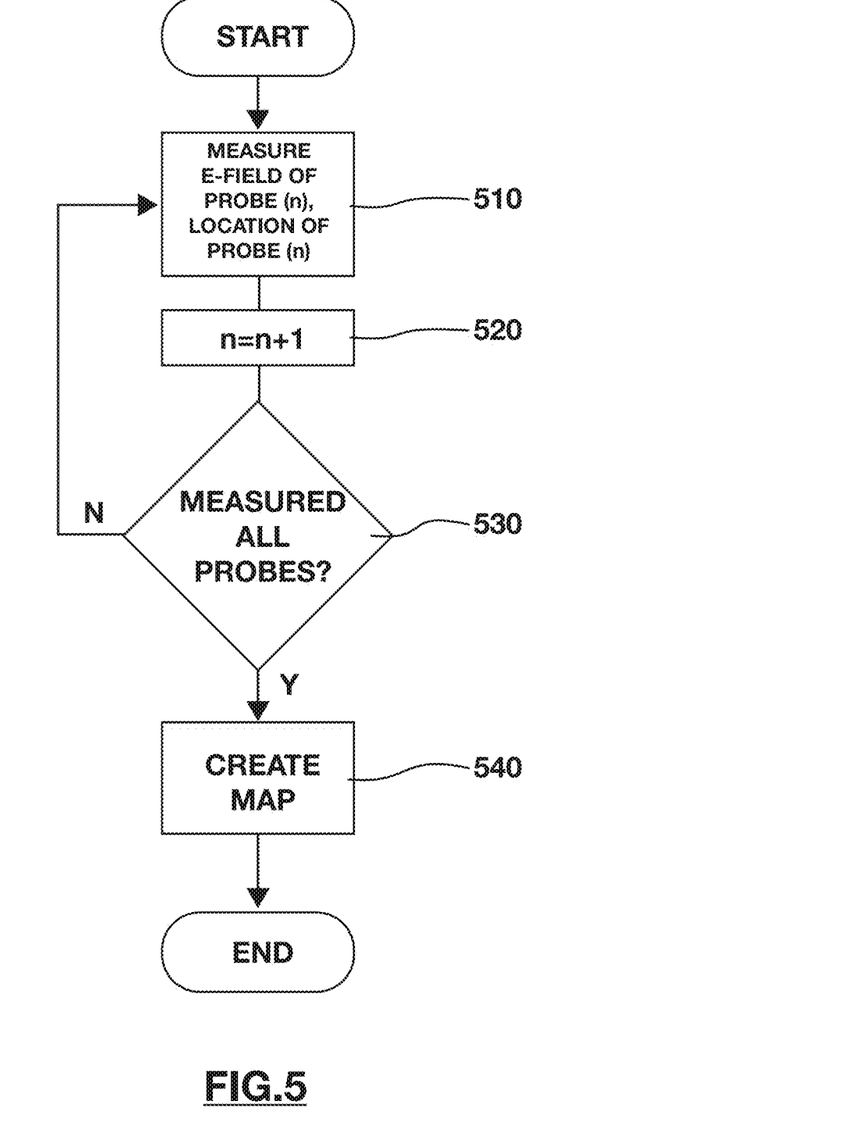
FIG. 5 is a flowchart of the operational program of the electrofishing monitors.

Now referring to FIG. 5 which depicts a flowchart of the operational use of the mobile electric field monitors in creating a field map. Each electric field is measured 510 in a sequential fashion 520. Once all of the electric field monitors have sampled 530 an electric field map is created.

Figure 6:
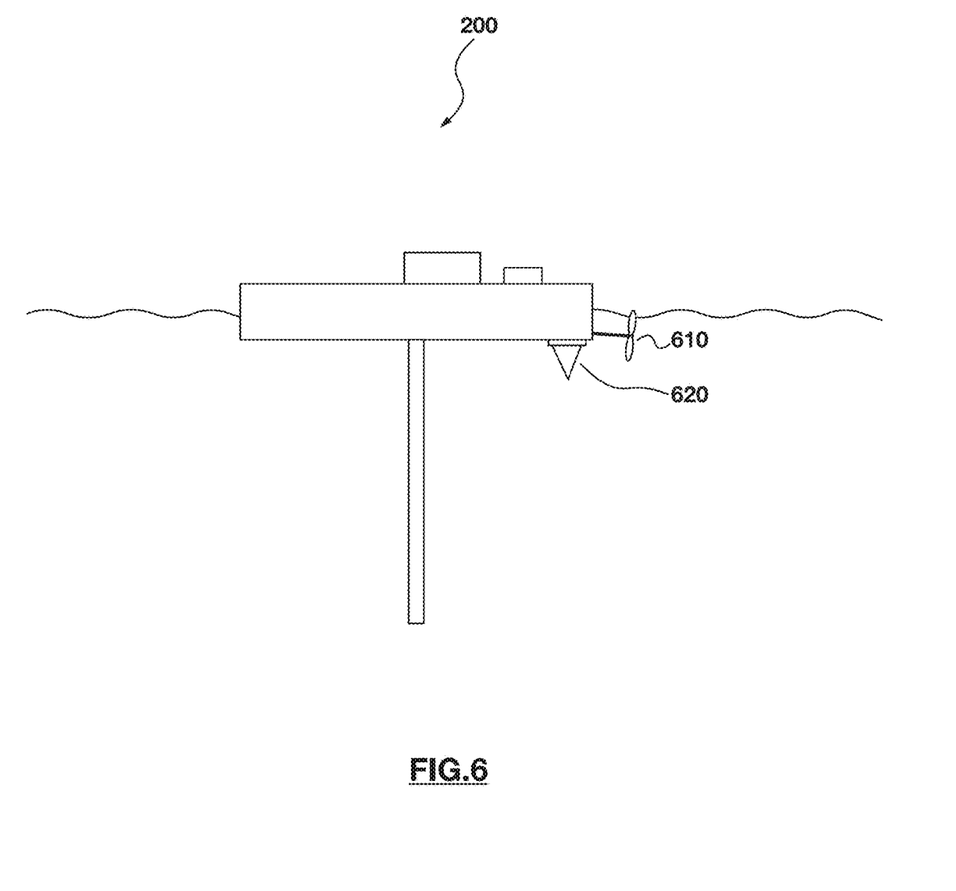
FIG. 6 is a representative diagram of the preferred embodiment with a remote positioning device.

Now referring to FIG. 6 which depicts an alternate embodiment of the mobile efield monitor 200. The mobile efield monitor 200 may be remotely positioned by a power source 610 and a rudder 620. The mobile efield monitor could also move via an internally programming system that designates certain waypoints and/or covers an area of a body of water.

Figure 7:
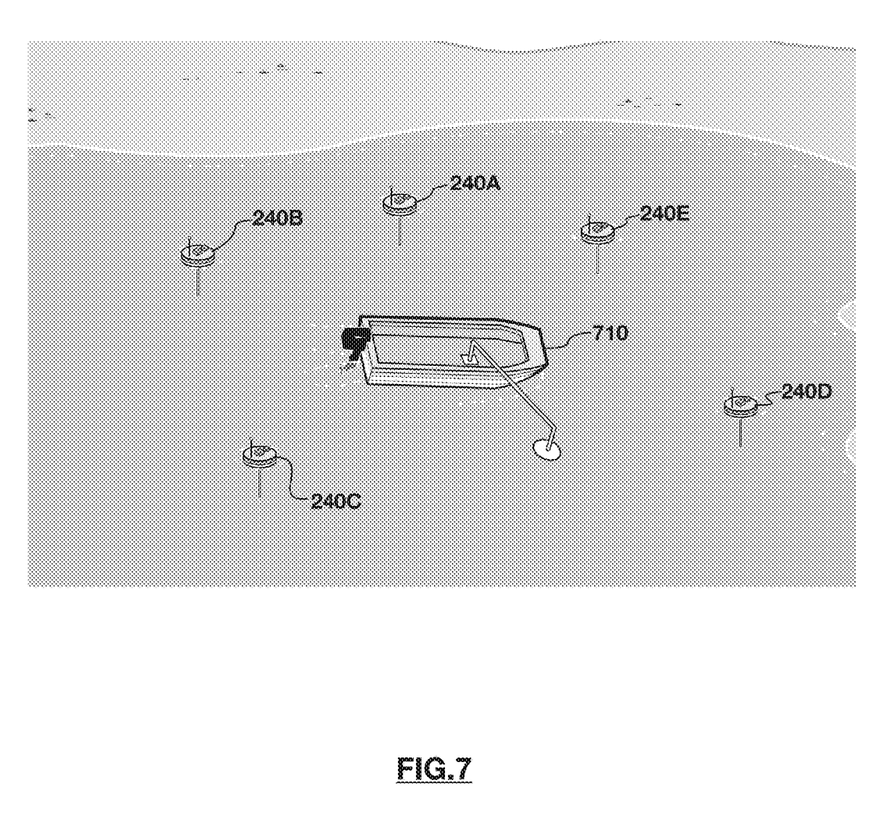
FIG. 7 is an alternate embodiment of FIG. 4 with use of an electrofishing boat.

Now referring to FIG. 7 which depicts an alternate embodiment of the mobile efield monitor's 200 use in a body of water. An electrofishing boat 710 is located on the body of water proximate to a number mobile efield monitors with wireless connections 240A, 240B, 240C, 240D, and 240E.

Alternate embodiments include the use of mobile efield monitors proximate to electric field barriers. The use of the mobile efield monitors could be used to map the field strength of the electric field barriers. Alternately, the mobile electric field monitors can be used to interactively modify, in a closed loop fashion, the field strength of a barrier. This interactive modification could be used to reduce the amount of (and hence cost) of electricity consumed by the barrier. Also, the mobile electric field monitors can be used to determine if the barrier becomes inoperable.

Persons skilled in the art will recognize that many modifications and variations are possible in the details, materials, and arrangements of the parts and actions which have been described and illustrated in order to explain the nature of this inventive concept and that such modifications and variations do not depart from the spirit and scope of the teachings and claims contained therein.

All patent and non-patent literature cited herein is hereby incorporated by references in its entirety for all purposes.

The invention claimed is:

1. A process of controlling an electric field of an electric field barrier in a body of water, the process comprising the steps of:
   determining an operability of the electric field barrier by:
      placing one or more floatable mobile electric field monitors in the body of water, proximate to the electric field barrier;
      each of the mobile electric field monitors making a multiplicity of electric field measurements via one or more mechanically connected electric field probes, which are adjustable depth wise in the body of water;
      storing the multiplicity of electric field measurements;
      associating a time stamp with each electric field measurement;
      measuring a geographic location coincident with each electric field measurement;
      transmitting the multiplicity of electric field measurements to a computer system operable to store the multiplicity of electric field measurements along with the respective time and geographic location; and
      executing a stored computing system such that the multiplicity of electric field measurements are mapped coincident with the geographic location to provide a real-time and graphical map of an electric field of the electric field barrier at one or more depths;
   remotely positioning the electric field monitors in the electric field barrier by moving the electric field monitors via an internal programming system that designates waypoints based on the real-time and graphical map of the electric field generated by the electric field barrier in the body of water; and
   the electric field monitors interactively modifying the electric field of the electric field barrier in a closed loop fashion by using reduced amount of electricity.

2. The process of using multiple electric field monitors as in claim 1 located proximate to the electric field barrier, wherein the electric field monitors are remotely positioned by a power source and a rudder.

3. The process of using multiple electric field monitors as in claim 1 located proximate to the electric field barrier, wherein the electric field monitors connect to a base station and transmit multiplicity of electric field measurements to the base station via a wireless communication network.

4. The process of using multiple electric field monitors as in claim 3 located proximate to the electric field barrier, wherein the base station processes the data and generates real-time electric field maps.

* * * * *